US009786356B2

United States Patent
Wang et al.

(10) Patent No.: US 9,786,356 B2
(45) Date of Patent: Oct. 10, 2017

(54) MEMORY DEVICE WITH ADAPTIVE VOLTAGE SCALING BASED ON ERROR INFORMATION

(71) Applicant: QUALCOMM Incorporated, San Diego, CA (US)

(72) Inventors: Zhongze Wang, San Diego, CA (US); Niladri Narayan Mojumder, San Diego, CA (US); Jonathan Liu, Folsom, CA (US); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 127 days.

(21) Appl. No.: 14/611,056

(22) Filed: Jan. 30, 2015

(65) Prior Publication Data

US 2016/0225436 A1 Aug. 4, 2016

(51) Int. Cl.
| | | |
|---|---|---|
| *G11C 29/00* | (2006.01) | |
| *G11C 11/417* | (2006.01) | |
| *G06F 11/07* | (2006.01) | |
| *G11C 29/02* | (2006.01) | |
| *G11C 5/14* | (2006.01) | |
| *G11C 7/10* | (2006.01) | |
| *G11C 7/22* | (2006.01) | |

(52) U.S. Cl.
CPC .......... *G11C 11/417* (2013.01); *G06F 11/073* (2013.01); *G06F 11/076* (2013.01); *G06F 11/0793* (2013.01); *G11C 29/021* (2013.01); *G11C 29/028* (2013.01); *G11C 5/14* (2013.01); *G11C 5/147* (2013.01); *G11C 7/1045* (2013.01); *G11C 7/22* (2013.01); *G11C 2207/2254* (2013.01)

(58) Field of Classification Search
CPC .. G11C 11/417; G06F 11/0793; G06F 11/076; G06F 11/073
See application file for complete search history.

(56) References Cited

U.S. PATENT DOCUMENTS

| | | | |
|---|---|---|---|
| 7,581,154 B2 | 8/2009 | Rai et al. | |
| 8,363,487 B2 | 1/2013 | Ehrenreich et al. | |
| 8,713,404 B2 | 4/2014 | Fai et al. | |
| 8,769,376 B2 | 7/2014 | Khellah et al. | |
| 8,879,350 B2 | 11/2014 | Khailany et al. | |
| 2004/0088624 A1* | 5/2004 | Gauthier | G01R 31/31924 714/737 |

(Continued)

*Primary Examiner* — Thien D Nguyen
(74) *Attorney, Agent, or Firm* — Qualcomm Incorporated-Toler

(57) ABSTRACT

A method of operation of a memory device includes, for each operating frequency of multiple operating frequencies, determining a target voltage level of a supply voltage. For example, a first target voltage level for a first operating frequency of the multiple operating frequencies is determined. The method includes accessing first data from the memory device while the memory device is operating at the first operating frequency and is powered by the supply voltage having a first voltage level. The method includes determining a first number of errors associated with the first data. The method further includes, in response to the first number of errors satisfying a threshold, adjusting the supply voltage to a second voltage level that is greater than the first voltage level.

30 Claims, 5 Drawing Sheets

(56) References Cited

U.S. PATENT DOCUMENTS

| | | | |
|---|---|---|---|
| 2009/0016140 A1* | 1/2009 | Qureshi | G11C 5/147 365/227 |
| 2010/0169729 A1* | 7/2010 | Datta | G11C 29/028 714/746 |
| 2011/0219274 A1* | 9/2011 | Cho | G06F 11/00 714/708 |
| 2012/0224425 A1* | 9/2012 | Fai | G11C 11/5642 365/185.09 |
| 2013/0249610 A1* | 9/2013 | Hara | H03L 7/00 327/159 |
| 2015/0006915 A1* | 1/2015 | Ganesan | G06F 1/26 713/300 |
| 2015/0106671 A1* | 4/2015 | Guo | G11C 5/147 714/721 |
| 2015/0287444 A1* | 10/2015 | Lee | G11C 7/08 713/322 |

* cited by examiner

FIG. 2

MEMORY DEVICE WITH ADAPTIVE VOLTAGE SCALING BASED ON ERROR INFORMATION

I. FIELD

The present disclosure is generally related to a memory device with an adjustable supply voltage.

II. DESCRIPTION OF RELATED ART

Advances in technology have resulted in smaller and more powerful computing devices.

For example, a variety of portable personal computing devices, including wireless telephones such as mobile and smart phones, tablets and laptop computers are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing and networking capabilities.

A computing device, such as a wireless computing device, may include one or more memories to store instructions and data. For example, an electronic device may include a processor and a static random-access memory (SRAM) device. The processor may store and retrieve instructions and data using the SRAM device. The SRAM device may be powered by a supply voltage having a voltage level that is selected based on one or more operational characteristics of the SRAM device. To illustrate, transistors typically operate faster with an increased supply voltage. If operation of the SRAM device is slower than designed (e.g., outside a tolerance range indicated by a design specification), the SRAM device can operate faster if the voltage level of the supply voltage is increased.

Voltage levels for SRAM devices are typically chosen on a "pessimistic" basis. For example, if a large number of SRAM devices are fabricated, a common voltage level for the SRAM devices may be selected based on a "worst case" scenario in order to increase device yield. The worst case scenario may take into account performance and reliability degradations of the SRAM device over time resulting from bias temperature instability (BTI) experienced at cells of the memory device. However, operating a "strong" (e.g., fast) SRAM device based on the worst case scenario consumes power and may cause voltage stress to transistors of the SRAM device.

III. SUMMARY

The present disclosure describes a memory device that adaptively scales, for multiple operating frequencies of the memory device, a voltage level of a supply voltage based on errors detected by error detection circuitry. For example, the memory device may include memory cells (e.g., multiple cells, such as an array of cells). In a particular aspect, the memory device may be a static random-access memory (SRAM) device that includes an array of SRAM cells. Error detection circuitry may be coupled to the array and may determine whether errors exist in data accessed from the array when the array is operated at a first operating frequency. For example, a portion of the data stored in the array (e.g., one or more data words stored in a set of memory cells of the array) may be accessed during a test process and may be provided to the error detection circuitry. The error detection circuitry may include parity check circuitry and/or an error correcting code (ECC) decoder, and the error detection circuitry may indicate whether an error is detected in the data. Adjustment circuitry coupled to the error detection circuitry may determine a number of errors in the data. Based on a comparison of the number of errors to a threshold, the adjustment circuitry may determine a first target voltage level for the first operating frequency or may cause a voltage level of a supply voltage to be adjusted (e.g., increased) and the data to be accessed again (e.g., the process of accessing the data and determining the number of errors may be repeated).

To illustrate, during a first test process, a controller may operate the array at a first operating frequency (corresponding to a frequency of a clock signal provided by the controller to the array) and the adjustment circuitry may cause the voltage level of the supply voltage to be set at a first test voltage level. While the array is operating at the first operating frequency and is powered by the supply voltage having the first test voltage level, first data may be accessed from the array and error indications may be provided to the adjustment circuitry from the error detection circuitry. The adjustment circuitry may count a first number of errors in the first data, and if the first number of errors fails to satisfy (e.g., exceed) a threshold, the adjustment circuitry may determine a first target voltage level for the first operating frequency based on the first test voltage level. If the first number of errors satisfies (e.g., exceeds) the threshold, the adjustment circuitry may cause the voltage level of the supply voltage to be adjusted (e.g., increased) from the first test voltage level to a second test voltage level. After adjusting the supply voltage, second data may be accessed from the array while the array is operated at the first operating frequency and the supply voltage has the second test voltage level. The first data and the second data may be accessed from a same location (e.g., a set of memory cells) in the array, but the first number of errors in the first data and a second number of errors in the second data may be different due to the different voltage levels of the supply voltage during the corresponding memory accesses. If the second number of errors fails to satisfy the threshold, the first target voltage level may be determined based on the second test voltage level. If the second number of errors satisfies the threshold, the above-described process may continue (e.g., using a third test voltage level) until a test voltage level is determined at which a corresponding number of errors fails to exceed the threshold or until a highest test voltage level is tested. If the number of errors satisfies the threshold when the supply voltage is set to the highest test voltage, a failure condition may be generated. When a failure condition is generated, the array may not be operated at the first operating frequency or the target voltage level for the first operating frequency may be set to the highest test voltage level and the array may be operated at a reliability level lower than a target reliability level.

Target voltage levels for other operating frequencies of the other operating frequencies may be determined in a similar manner to the first target voltage level for the first operating frequency. For example, the array may be capable of being operated in multiple operating modes that correspond to multiple operating frequencies. As one non-limiting example, the array may be operated in a normal operating mode, a high-speed operating mode (e.g., a turbo operating mode), and a low-power operating mode. As another example, the array may be operated at one or more operating frequencies in a range of operating frequencies. The first test process may include determining test voltage levels for each operating frequency of the multiple operating frequencies. After determination of test voltage levels for the multiple operating frequencies, a bitmap that indicates the test voltage levels may be stored in a non-volatile memory of the memory device. After completion of the first test process, when the memory array is operated in a particular operating mode (corresponding to a particular operating frequency), the adjustment circuitry may cause the voltage level of the supply voltage to be set at a particular test voltage level corresponding to the particular operating frequency. The particular test voltage level may be determined (e.g., identified) by accessing the bitmap.

During the operational life of the memory device, the array (e.g., the memory device) may experience degradation due to aging, which may change operation of the array. To reduce or compensate for a reduction in performance of the array due to degradation, additional test processes may be performed during the operational life of the array to determine updated target voltage levels of the supply voltage that compensate for changes (e.g., degradation) to the array (e.g., memory device) during the operational life. In this manner, the supply voltage may be adaptively scaled through the operational life of the memory device instead of being set at a fixed voltage level.

In a particular aspect, a method of operation of a memory device includes, for each operating frequency of multiple operating frequencies, determining a target voltage level of a supply voltage. Determining the target voltage level for each operating frequency includes determining a first target voltage level for a first operating frequency of the multiple operating frequencies. Determining the first target voltage level includes accessing first data from the memory device while the memory device is operated at the first operating frequency and is powered by the supply voltage having a first voltage level. Determining the first target voltage level includes determining a first number of errors associated with the first data. Determining the first target voltage level further includes, in response to the first number of errors satisfying a threshold, adjusting the supply voltage to a second voltage level that is greater than the first voltage level.

In another particular aspect, a memory device includes an array of storage elements. The apparatus includes error detection circuitry configured to detect errors in data stored in the array. The apparatus further includes adjustment circuitry configured to determine a target voltage level of a supply voltage for the array for each operating frequency of multiple operating frequencies of the array. A first target voltage level may be determined based on a result of a comparison of a number of errors detected by the error detection circuitry and a threshold. The first target voltage level may correspond to a first operating frequency of the multiple operating frequencies.

In another particular aspect, an apparatus includes means for storing data. The apparatus further includes means for determining a target voltage level of a supply voltage for the means for storing for each operating frequency of multiple operating frequencies of the means for storing. A first target voltage level may be determined based on a result of a comparison of a number of errors detected in the data and a threshold. The first target voltage level may correspond to a first operating frequency of the multiple operating frequencies.

In another particular aspect, a non-transitory computer-readable medium includes instructions that, when executed by a processor, cause the processor to perform operations including, for each operating frequency of multiple operating frequencies of a memory device, determining a target voltage level of a supply voltage. Determining a first target voltage level for a first operating frequency of the multiple operating frequencies includes accessing first data from a memory device while the memory device is operated at a first operating frequency and is powered by the supply voltage having a first voltage level. Determining the first target voltage level includes determining a first number of errors associated with the first data. Determining the first target voltage level further includes, in response to the first number of errors satisfying a threshold, adjusting the supply voltage to a second voltage level that is greater than the first voltage level.

One particular advantage provided by at least one of the disclosed aspects is a method of providing a supply voltage to a memory device that may be adaptively scaled based on performance of the memory device. Adaptively scaling the supply voltage may compensate for degradation to the memory device during the operational life of the memory device. For example, the memory device may be an SRAM, and the reliability of the SRAM may degrade during the operational life of the SRAM due to bias temperature instability (BTI) experienced by the SRAM. Because the supply voltage is adaptively scaled, the supply voltage may initially be provided at a lower voltage level than a "pessimistic" voltage level estimated based on "worst-case" estimates, and the supply voltage may be increased later in the operational life of the memory device to reduce one or more effects of the degradation. By adaptively scaling the voltage, instead of setting the voltage level to the pessimistic estimate, the memory device may operate with reduced operating margins, such as a voltage supply margin. Additionally, by determining target voltage levels for each of multiple operating frequencies, the memory device may operate with reduced operating margins at multiple operating frequencies. Operating with reduced operating margins may provide cost and power savings as compared to memory devices that are not able to dynamically scale the supply voltage. Additionally, operating at lower voltage levels may decrease voltage stress to transistors of the memory device, which may increase the operational life of the memory device.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

FIG. 1 is a block diagram of a particular illustrative embodiment of a system configured to adjust a supply voltage provided to an array of memory cells based on errors detected in data stored at the array;

FIG. 2 includes plots that illustrate voltage levels corresponding to the array passing a testing process for multiple operating frequencies;

V. DETAILED DESCRIPTION

Particular embodiments of the present disclosure are described below with reference to the drawings. In the description, common features are designated by common reference numbers.

Figure 1:
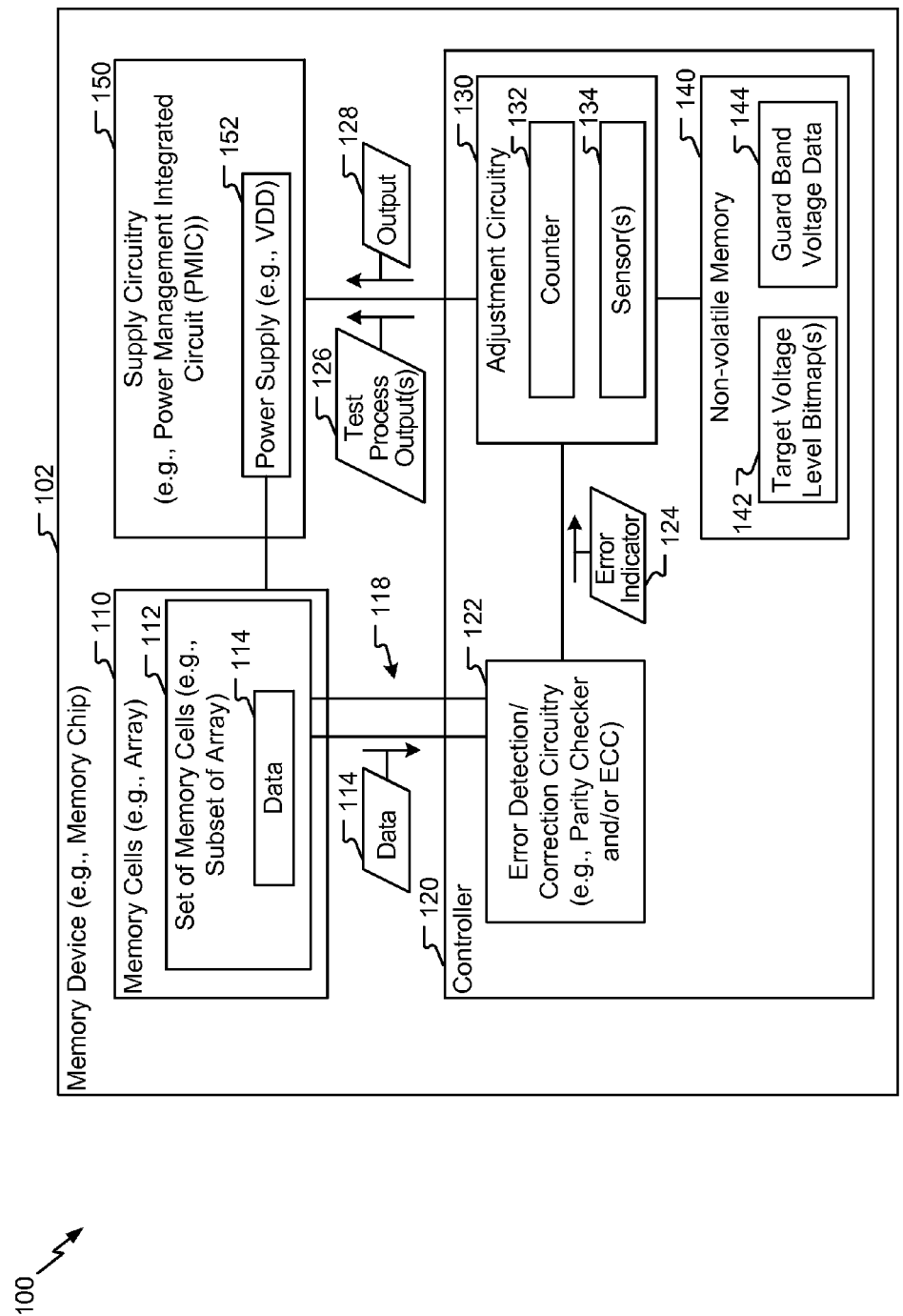

Referring to FIG. 1, a particular illustrative embodiment of a system 100 configured to determine, for multiple operating frequencies of an array of memory cells, target voltage levels based on errors detected in data stored at the array and to adjust a supply voltage (VDD) provided to the array is disclosed. The system 100 includes a memory device 102, such as a memory chip (e.g., a memory die). The memory device 102 may include a memory array 110, a controller 120, and supply circuitry 150. In a particular embodiment, the memory array 110 is a static random access memory (SRAM) array. In other embodiments, the memory array 110 is another type of memory array.

The memory array 110 may include a plurality of memory cells. A set of memory cells 112 of the memory array 110 (e.g., a subset of the memory array 110) may be selected as representative of an entirety of the memory array 110. For example, the set of memory cells 112 may include memory cells from various locations in the memory array 110 such that conditions of the set of memory cells 112 are representative of the conditions of the entire memory array 110. The set of memory cells 112 may include cells that correspond to one or more rows and one or more columns of the memory array 110. Additionally, the set of memory cells 112 may be selected such that data (e.g., one or more data words) is stored in the set of memory cells 112. In a particular embodiment, a first number of memory cells included in the set of memory cells 112 is less than a number of memory cells included in the memory array 110. In another particular embodiment, the set of memory cells 112 includes an entirety of the memory array 110.

Each cell of the set of set of memory cells 112 may be coupled to the controller 120 and configured to provide an indication of a value (e.g., a logical value) of the cell. For example, each cell of the set of memory cells 112 may be configured to store a value (e.g., a logical value) at a node (e.g., a node of an SRAM cell). In other implementations, the values may be stored in other manners (e.g., in a resistive state of a memory cell, as a non-limiting example).

The controller 120 may be configured to perform control operations for the memory array 110 during read operations and write operations. The controller 120 may also be configured to operate the memory array 110 in one or more operating modes. In a particular embodiment, the controller 120 is configured to operate the memory array 110 in one of three particular operating modes, a "turbo" (e.g., high speed) operating mode, a "nominal" (e.g., normal) operating mode, and a "supply voltage supervisor" (SVS) (e.g., low-power) operating mode. In other embodiments, the controller 120 is configured to operate the memory array 110 in more than three or fewer than three operating modes. In some implementations, the controller 120 may be configured to operate the memory array 110 at one or more operating frequencies within a range of operating frequencies. A particular operating mode may be determined based on one or more target characteristics of the memory array 110, such as power consumption, speed, etc. When the memory array 110 is operating in a particular operating mode, the memory array 110 may be operated at a particular operating frequency. Operating the memory array 110 at the particular operating frequency may refer to providing a clock signal having a particular frequency to the memory array 110.

In a particular embodiment, the memory array 110 and the memory device 102 are operated at the same operating mode and/or the same operating frequency. In other embodiments, the operating mode and/or the operating frequency of the memory array 110 may be different from the operating mode and/or the operating frequency of the memory device 102. For example, the memory device 102 may include other memory arrays (not shown), and each memory array may receive a different clock signal to enable operation of the memory arrays at different operating frequencies (e.g., in different operating modes).

Additionally, the controller 120 may be configured to determine target voltages for multiple operating frequencies of the memory array 110 based on a number of errors detected in data 114 received from the set of memory cells 112, as described herein. The data 114 may correspond to the data stored at the set of memory cells 112, but one or more bits may be different (e.g., one or more errors may exist) based on one or more operating conditions of the memory array 110. For example, the number of errors detected in the data 114 may be related to an age of the memory array 110, to the operating frequency of the memory array 110 when the data 114 is received, and to a voltage level of a supply voltage (VDD) provided to the memory array 110 when the data 114 is received. Increasing the voltage level of the supply voltage (VDD) may reduce a number of errors detected in the data 114, which may increase reliability of the memory array 110 and enable the memory array 110 to perform at target reliability levels. However, increasing the voltage level of the supply voltage (VDD) may also cause voltage stress to the memory array 110 and may decrease the operational life of the memory array 110. Thus, the controller 120 may be configured to determine target voltages for the multiple operating frequencies at various stages of the operational life of the memory array 110, and to adaptively scale the voltage level of the supply voltage (VDD) to a target (e.g., "minimum") voltage level associated with a target reliability level (e.g., a threshold number of errors) for a selected operating frequency.

The controller 120 may include circuitry, such as error detection/correction circuitry 122 and adjustment circuitry 130. The error detection/correction circuitry 122 may be coupled to the set of memory cells 112 via lines 118. In some embodiments, each line of the lines 118 may be coupled to a different memory cell and may be configured to provide the error detection/correction circuitry 122 with an indication of a value stored at the memory cell. In other embodiments, data words (e.g., multiple bits of data) may be provided via each line. Additionally, driver circuitry (not shown) may be coupled to the memory array 110 to provide the data 114 to the error detection/correction circuitry 122. Although two lines are illustrated in FIG. 1, in other embodiments, the lines may include more than two lines, or the memory array 110 and the error detection/correction circuitry 122 may be connected by a single line.

The error detection/correction circuitry 122 may be configured to read the data 114 (e.g., one or more data words) from the set of memory cells 112 while the supply voltage (VDD) has a particular voltage level and while the memory array 110 is operating at a particular operating frequency. In a particular embodiment, the error detection/correction circuitry 122 accesses (e.g., reads) multiple data words from the set of memory cells 112 concurrently. In another embodiment, the error detection/correction circuitry 122 accesses (e.g., reads) data words from the set of memory cells 112 one data word at a time until an entirety of the data 114 is read.

The error detection/correction circuitry 122 may be configured to detect errors in the data 114. For example, the error detection/correction circuitry 122 may process the data 114 and determine whether the data 114 is correct or whether the data 114 includes one or more errors. The error detection/correction circuitry 122 may detect errors based on information included in the data 114 (e.g., parity bits, check bits, error correcting code (ECC) bits, etc.). In some implementations, the error detection/correction circuitry 122 may include parity check circuitry configured to determine whether the data 114 includes one or more parity errors (e.g., based on one or more parity bits included in the data 114). Additionally or alternatively, the error detection/correction circuitry 122 may include an error correcting code (ECC) decoder configured to determine whether the data 114 includes one or more bit errors (e.g., based on ECC data included in the data 114). In a particular embodiment, the error detection/correction circuitry 122 includes a single error correction-double error detection (SEC-DED) ECC decoder that is configured to correct single-bit errors (e.g., a single incorrect bit of a data word) and to detect multi-bit errors (e.g., two or more incorrect bits in a data word).

The error detection/correction circuitry 122 may be configured to provide an error indicator 124 in response to detecting an error in the data 114 received from the set of memory cells 112. For example, the error indicator 124 may include or correspond to a flag (e.g., an error flag or a parity flag) that is asserted by the error detection/correction circuitry 122 when an error is detected. In a particular embodiment, the error indicator 124 may indicate a type of error that is detected. For example, the error indicator 124 may indicate whether an error is a single-bit error or a multi-bit error. In a particular embodiment, the error detection/correction circuitry 122 may generate the error indicator 124 for each error detected, such that multiple error indicators 124 are generated when multiple errors are detected in the data 114 received from the set of memory cells 112. In another embodiment, the error indicator 124 may indicate a total number of errors in the data 114. The error indicator(s) 124 may be provided to the adjustment circuitry 130 for counting a number of errors in the data 114.

The adjustment circuitry 130 may be configured to determine target voltage levels of a supply voltage (VDD) provided to the memory array 110 for one or more operating frequencies of the memory array 110 based on a number of errors indicated by the error indicator(s) 124. For example, the adjustment circuitry 130 may be configured to determine a first target voltage level of a supply voltage (VDD) for a first operating frequency of the memory array 110 based on a result of a comparison of the number of errors detected in the data 114 by the error detection/correction circuitry 122 and a threshold, as further described herein. Additionally, the adjustment circuitry 130 may be configured to determine a target voltage level for each other operating frequency of multiple operating frequencies. The target voltage levels may be determined during one or more test processes that occur during an operational life of the memory array 110. The test processes may be performed at various stages of the operational life of the memory array 110. For example, the controller 120 may initiate performance of a test process after a particular number of power-on operations of the memory device 102. As another example, the controller 120 may initiate a test process in response to the error detection/correction circuitry 122 detecting an uncorrectable error (e.g., a multi-bit error) during a read operation performed at the memory array 110. As another example, the controller 120 may initiate performance of a test process in response to detecting a significant change to one or more characteristics of the memory array 110. To illustrate, the controller 120 may include one or more sensor(s) configured to sense characteristics of the memory array 110, such as a temperature, a voltage level of the supply voltage (VDD), an operating frequency, an operating mode, a workload, other characteristics, or a combination thereof.

The adjustment circuitry 130 may be configured to provide a test process output 126 to the supply circuitry 150 to cause the supply voltage (VDD) to be set at a test voltage level during performance of a test process. For example, after initiating the test process, the adjustment circuitry 130 may provide the test process output 126 indicating a first test voltage to the supply circuitry 150. Additionally, after initiating the test process, the controller 120 may set the operating frequency of the memory array 110 at a first operating frequency to be tested. As described above, setting the operating frequency of the memory array 110 may include setting a frequency of a clock signal provided to the memory array 110. While the memory array 110 is operated at the first operating frequency and the supply voltage (VDD) is set to the test voltage level, the set of memory cells 112 may be accessed and the data 114 may be received by the error detection/correction circuitry 122. When the error detection/correction circuitry 122 detects errors in the data 114, one or more error indicators 124 may be provided to the adjustment circuitry 130. The adjustment circuitry 130 may receive the one or more error indicators 124 and may count a number of errors detected in the data 114. For example, the adjustment circuitry 130 may include a counter 132 configured to count the number of errors.

When the number of errors satisfies a threshold (e.g., the number of errors is greater than the threshold), a determination may be made that the test voltage level is associated with a "fail" status for the memory array 110 when operated at the first operating frequency. A fail status may represent that a reliability level of the memory array 110 is less than a target reliability level when the memory array 110 is operated at the particular operating frequency and when the voltage level of the supply voltage (VDD) has the test voltage level. In a particular embodiment, the threshold is one, and the number of errors satisfies the threshold when the number of errors is greater than one. This threshold may correspond to detection of a multi-bit error, which may be uncorrectable by the SEC-DED decoder (e.g., the error detection/correction circuitry 122). When the number of errors satisfies the threshold, the voltage level of the supply voltage (VDD) may be adjusted (e.g., increased) from the test voltage level to a second test voltage level that is greater than the test voltage level (e.g., by providing a second test process output 126 indicating the second test voltage level to the supply circuitry 150), and the set of memory cells 112 may be accessed again. The test process may continue in this manner until the number of errors in the data 114 during a memory access fails to satisfy the threshold or until each test voltage of a set of test voltages has been tested. If no test voltage is associated with the number of errors failing to satisfy the threshold, an error condition may be generated for the first operating frequency.

When the number of errors fails to satisfy the threshold (e.g., the number of errors is less than or equal to the threshold), a determination may be made that the test voltage level is associated with a "pass" status for the memory array 110 when operated at the first operating frequency. When the number of errors fails to satisfy the threshold, a first target voltage level for the first operating frequency may be determined based on the test voltage level. In a particular embodiment, the first target voltage level may be equal to the test voltage level. In another particular embodiment, the first target voltage level may be equal to the test voltage level increased by a guard band voltage component, as further described herein.

After the first target voltage level is determined for the first operating frequency, other target voltage levels for other operating frequencies may be determined as described above. For example, the memory array 110 may be operated in multiple operating modes corresponding to multiple operating frequencies. In this case, the first test process may include determining test voltage levels for each of the other operating frequencies as well as for the first operating frequency. For example, after determining the first test voltage level, the controller 120 may operate the memory array 110 at a different operating frequency and the above-described process may be repeated to determine a test voltage level corresponding to the different operating frequency. In this manner, multiple target voltage levels for multiple operating frequencies may be determined by the adjustment circuitry 130 during a single test process.

Additionally, test voltage levels for the multiple operating frequencies may be determined during additional test processes. For example, the adjustment circuitry 130 may be configured to determine the first target voltage level for the first operating frequency during a first test process. At a subsequent stage of the operational life of the memory device 102 (e.g., after the occurrence of one or more events or changes to one or more operating characteristics as described above), the adjustment circuitry 130 may determine a second target voltage level for the first operating frequency during a second test process. The second test process may occur subsequent to the first test process. During performance of the second test process, the first target voltage level may be used as a first test voltage level for determining the second target voltage level. If the first target voltage level is no longer associated with a pass status of the memory array 110 (as described above), a voltage level that is greater than the first target voltage level may be determined as the second target voltage level. Target voltage levels for other operating frequencies may be determined in a similar manner during the second test process.

After determining target voltage levels for multiple operating frequencies, the target voltage levels may be used to set the supply voltage during operation of the memory array 110. For example, after determining the target voltage levels (e.g., after performing the first test process), the controller 120 may operate the memory array 110 in a selected operating mode that corresponds to a particular operating frequency. The adjustment circuitry 130 may provide an output 128 (e.g., an output signal) to the supply circuitry 150 to set the supply voltage (VDD). For example, the output 128 may indicate a particular target voltage level corresponding to the particular operating frequency.

The output 128 of the adjustment circuitry 130 may be provided to the supply circuitry 150. For example, the supply circuitry 150 (e.g., a power supply circuit) may include or correspond to a power management integrated circuit (PMIC). The supply circuitry 150 may include or may be coupled to a power supply 152, such as a power supply configured to provide the supply voltage (VDD) to the memory array 110. For example, the power supply 152 may be a common supply to the set of memory cells 112 and to other cells of the memory array 110 (e.g., the memory array 110 may be powered by a single power supply that is common to each cell of the memory array 110). The supply circuitry 150 may be configured to provide the supply voltage (VDD) to the memory array 110 during operation of the memory array 110. Additionally, responsive to receipt of the output 128, the supply circuitry 150 may control a value of the supply voltage (VDD) provided to the memory array 110. For example, the supply circuitry 150 may set or adjust a value of the supply voltage (VDD) provided by the power supply 152 to a target voltage level indicated by the output 128. Additionally, the supply circuitry 150 may set or adjust a value of the supply voltage (VDD) provided by the power supply 152 to a test voltage level indicated by the test process output 126 during a test process. Adjusting the supply voltage (VDD) based on the voltage level indicated by the output 128 may improve reliability of the memory array 110 by compensating for the effects of degradation during the operational life of the memory array 110.

In some implementations, in addition to causing the voltage level of the supply voltage (VDD) to be adjusted, the adjustment circuitry 130 may initiate one or more other corrective actions. For example, the corrective action may include or correspond to adjusting a wordline under-drive value applied during a read operations performed at the memory array 110 and/or adjusting a read current applied to cells of the memory array 110 during the read operation. Additionally or alternatively, the corrective action may include or correspond to modifying an error correction scheme, such as increasing an error correction capability of the error detection/correction circuitry 122 and/or increasing a number of parity bits associated with data stored at the memory array 110. The adjustment circuitry 130 may send the output 128 to one or more components included in or coupled to the system 100. The one or more components may be configured to initiate execution of and/or to execute the corrective action associated with the output 128. Additionally or alternatively, the controller 120 may initiate the corrective action. For example, when the memory array 110 is to be operated with the supply voltage (VDD) set at or below a particular voltage level, the controller 120 may determine a particular operating frequency corresponding to a target voltage level that does not exceed the particular voltage level, and the controller 120 may operate the memory array 110 at the particular operating frequency.

In addition to providing the output 128, the adjustment circuitry 130 may be configured to generate a bitmap (e.g., a target voltage level bitmap) indicating the target voltage levels for the multiple operating frequencies in response to determining the target voltage levels. For example, the adjustment circuitry 130 may be configured to select the test voltage levels during the tests processes from a group of test voltages. The bitmap may indicate, for each of the multiple operating frequencies, whether the memory array 110 is associated with a pass status or a fail status when the supply voltage (VDD) is set at each test voltage level of the group of test voltage levels. Additional details regarding the bitmap are described with reference to FIG. 2. After generating the bitmap, the adjustment circuitry 130 may store the bitmap. For example, the controller 120 may include a non-volatile memory 140, and the bitmap may be stored in the non-volatile memory 140 as one or more target voltage level bitmap(s) 142. The non-volatile memory 140 may be any type of non-volatile memory. In some embodiments, the non-volatile memory 140 may be a one-time programmable (OTP) memory.

In some implementations, an initial target voltage level bitmap may be stored in the non-volatile memory 140 prior to the memory array 110 being shipped to a customer. For example, during fabrication of the memory array 110, initial target voltage levels for the multiple operating frequencies may be determined by in-line testing. A first bitmap may be generated to indicate the initial target voltage levels and may be stored as one of the one or more target voltage level bitmap(s) 142. Additionally, a target voltage level bitmap may be generated and stored for each test process performed by the controller 120. For example, a first target voltage level bitmap may be generated during a first test process, a second target voltage level bitmap may be generated during a second test process, and both the first target voltage level bitmap and the second target voltage level bitmap may be stored as the one or more target voltage level bitmap(s) 142.

The target voltage level bitmap(s) 142 may be accessed by the adjustment circuitry 130 (or the controller 120) to determine (e.g., identify) a target voltage level to set the supply voltage (VDD) during operation of the memory array 110. For example, a most recently generated bitmap of the one or more target voltage level bitmap(s) 142 may be accessed to determine (e.g., identify) a target voltage level corresponding to a particular operating frequency, and the target voltage level may be indicated in the output 128 provided to the supply circuitry 150. In other implementations, the controller 120 may select a particular voltage level that the supply voltage (VDD) is not to exceed during operation, and the controller 120 (e.g., the adjustment circuitry 130) may access the one or more target voltage level bitmap(s) 142 to determine (e.g., identify) an operating frequency that corresponds to a target voltage level that does not exceed the particular voltage level. Additionally, target voltage level bitmaps may be compared to identify trends in operating conditions of the memory array 110. For example, the controller 120 and/or the adjustment circuitry 130 may compare a first target voltage level bitmap generated based on a first test process to a second target voltage level bitmap generated based on a second test process to determine changes in operating conditions between a time of the second test process and a time of the first test process. The changes may be used in selecting an operating condition of the memory array 110. For example, an operating frequency that is associated with a significant increase in a target voltage level may not be selected as an operating frequency to avoid a potential error condition due to additional degradation. Although described above as a target voltage level bitmap, in other implementations data representing the target voltage levels may be stored in other forms. For example, data representing the target voltage levels for the multiple operating frequencies may be stored as a record, a table, or another data structure, in the non-volatile memory 140.

In some implementations, the target voltage level for an operating frequency may be greater than a test voltage level at which the number of errors fails to satisfy the threshold (e.g., a target voltage level associated with a pass state). In these implementations, a guard band voltage component may be added to the test voltage level to determine the target voltage level. Adding the guard band voltage component may increase a likelihood that the supply voltage (VDD) does not fall below a voltage level associated with a fail status because of fluctuations in the voltage level due to one or more characteristics of the memory array 110.

The guard band voltage component may be based on one or more characteristics (e.g., operating characteristics) of the memory array 110 including a temperature, the target voltage level, a workload, an operating mode, an operating frequency, other characteristics, or a combination thereof.

Values for the guard band voltage component may be determined during product testing and may be stored as guard band voltage data 144 in the non-volatile memory 140. In some implementations, the guard band voltage component may be a fixed amount of voltage. In other implementations, the guard band voltage component may vary based on measurements of the one or more characteristics. In these implementations, the one or more sensors 134 may generate measurements of the one or more characteristics for use in determining the guard band voltage component. For example, the one or more sensors 134 may include a temperature sensor, a workload sensor, a voltage sensor, or other sensors or circuitry configured to measure the one or more characteristics. Based on output from the one or more sensors 134, the adjustment circuitry may select a corresponding value for the guard band voltage component from the guard band voltage data 144. After determining the guard band voltage component (e.g., the fixed amount of voltage or the value determined based on the output from the one or more sensors 134), the guard band voltage component may be added to the test voltage level to determine the target voltage level for the operating frequency.

During operation of the system 100, the controller 120 may initiate performance of a first test process. During performance of the first test process, the adjustment circuitry 130 may determine target voltage levels for multiple operating frequencies of the memory array 110. To illustrate, the controller 120 operates the memory array 110 at a first operating frequency and the adjustment circuitry 130 provides the test process output 126 indicating a first test voltage level to the supply circuitry 150 to cause the supply circuitry 150 to set the supply voltage (VDD) to the first test voltage level. While the memory array 110 is operated at the first operating frequency and the supply voltage (VDD) is set to the first test voltage level, first data (e.g., the data 114) may be accessed (e.g., read) from the set of memory cells 112. The error detection/correction circuitry 122 may determine whether any errors exist in the first data, and when errors exist, the error detection/correction circuitry 122 may provide one or more error indicators 124 to the adjustment circuitry 130. The adjustment circuitry 130 may determine a number of errors based on the one or more error indicators 124.

When the number of errors satisfies the threshold (e.g., the number of errors is greater than the threshold), the supply voltage (VDD) may be adjusted to a second voltage level that is greater than the first voltage level. For example, the adjustment circuitry 130 may provide another test process output 126 indicating the second test voltage level and the supply circuitry 150 may adjust the supply voltage (VDD) to the second voltage level. Second data may be read while the memory array 110 is operated at the first operating frequency and the supply voltage (VDD) has the second test voltage level. The second data may be read from the same location (e.g., the set of memory cells 112) as the first data, but may have one or more bits that are different due to differences in the supply voltage. When the number of errors detected in the second data satisfies the threshold, the supply voltage (VDD) may be increased and the process may be repeated.

When the number of errors detected in data received while the supply voltage (VDD) has a particular test voltage level fails to satisfy the threshold, the adjustment circuitry 130 may determine a first target voltage level corresponding to the first operating frequency based on the particular test voltage level. In some embodiments, a guard band voltage component is added to the particular test voltage level to determine the first target voltage level. In other embodiments, the guard band voltage component is not added (e.g., the first target voltage level is the particular test voltage level). After determining the first target voltage level, target voltage levels for other operating frequencies of the multiple operating frequencies may be determined in a similar manner to determining the first target voltage level for the first operating frequency. Additionally, the adjustment circuitry 130 may generate a target voltage level bitmap based on target voltage level(s) for one or more operating frequencies. The target voltage level bitmap may be stored as one of the one or more target voltage level bitmap(s) 142 at the non-volatile memory 140.

After performing the test process, the target voltage levels may be used to set the supply voltage (VDD) during different operating modes. For example, the controller 120 may select an operating mode for operating the memory array 110. The operating mode may be selected based on a target power consumption, a target speed, or other considerations. The adjustment circuitry 130 may provide the output 128 indicating a target voltage level that corresponds to an operating frequency associated with the selected operating mode. The adjustment circuitry 130 may access the one or more target voltage level bitmap(s) 142 stored in the non-volatile memory 140 to determine (e.g., identify) the target voltage level. The supply circuitry 150 may adjust the power supply 152 to set the supply voltage (VDD) at the target voltage level indicated by the output 128. When a different operating frequency is selected by the controller 120, the adjustment circuitry 130 may cause the supply circuitry 150 to adjust the supply voltage (VDD) to a target voltage level corresponding to the different operating frequency.

At different times throughout the operational life of the memory array 110, the controller 120 may initiate additional test processes. The additional test processes may be performed to update the target voltage levels for the multiple operating frequencies to account for changes to the memory array 110 due to degradation. For example, a supply voltage (VDD) level that is associated with a pass status at a first time may be associated with a fail status at a subsequent time due to effects of degradation. By performing additional test processes at subsequent times, the target voltage levels may be updated so that the target voltage levels are increased at later stages in the operational life of the memory array 110 to compensate for the effects of degradation.

As described with reference to FIG. 1, the present disclosure describes a system 100 that adaptively scales a supply voltage (VDD) that is provided to the memory array 110 to target voltage levels determined based on error information. For example, the controller 120 may determine a target voltage level for an operating frequency that is associated with a pass status (e.g., a number of errors in the data 114 fails to satisfy a threshold). Because a number of errors detected in the data 114 may increase during the operational life of the memory array 110, the number of errors (e.g., the error information) may be used as an indication of the age of the memory device. By adjusting the supply voltage (VDD) to target voltage levels determined based on the error information, the memory array 110, and therefore the memory device 102, may operate with reduced operating margins, such as a reduced voltage supply margin, as compared to memory arrays (e.g., SRAMs) that are not able to dynamically scale the supply voltage (VDD). For example, a voltage level of the supply voltage (VDD) may be determined based on performance of the memory array 110 (as indicated by the number of errors during a memory access) instead of being selected based on "pessimistic" operating estimates of a worst-case memory device. Operating the memory array 110 at reduced operating margins reduces power consumption of the memory array 110 and the memory device 102. Additionally, in particular implementations where the memory device 102 is an SRAM device, operating at reduced operating margins may reduce voltage stress to transistors of the SRAM device, which may increase the operational life of the SRAM device. Additionally, adjusting the voltage level of the supply voltage (VDD) based on multi-bit errors may further reduce operating margins as compared to adjusting the voltage level based on single-bit errors and multi-bit errors. For example, instead of increasing the voltage level of the supply voltage (VDD) to correct single-bit errors, the single-bit errors may be corrected by using a SEC-DED decoder as the error detection/correction circuitry 122.

Figure 2:
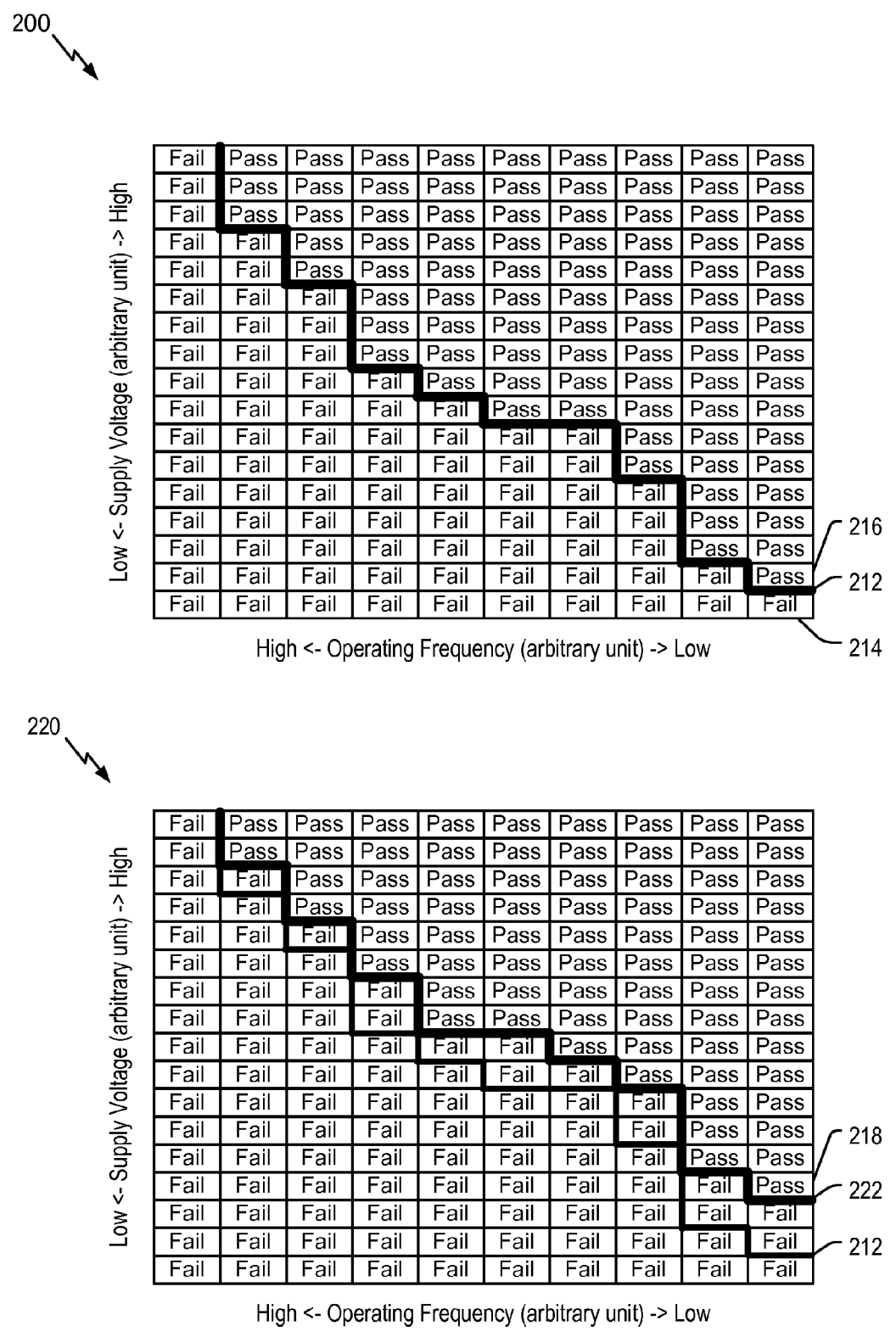

FIG. 2 depicts a plot 200 at a first time during an operational life of a memory device (e.g., an SRAM device), such as the memory device 102 of FIG. 1. For example, the first time (e.g., a first "stage of operation") may correspond to a time of an in-line test performed during fabrication of the memory device. Additionally or alternatively, the first time may correspond to a time during operation (e.g., use) of the memory device, such as after a particular number of power-on operations of the memory device, after error detection/correction circuitry detects an uncorrectable error (e.g., a multi-bit error) during a read operation, after detecting a significant change to one or more characteristics of the memory device, or after some other event during operation of the memory device. The plot 200 illustrates operating frequency (e.g., clock frequency) of the memory device (horizontal axis) and voltage level of a supply voltage (VDD) provided to the memory device (vertical axis). Each combination of operating frequency and voltage level in the plot 200 is associated with a pass status or a fail status of a test process, such as an error correcting code (ECC) decoding status associated with a decoding process. To illustrate, in the upper-right corner, lower operating frequencies and higher voltage levels are associated with pass statuses, and in the lower-left corner, higher operating frequencies and lower voltage levels are associated with fail statuses.

A boundary 212 indicates a target (e g, "minimum") voltage level for each operating frequency of multiple operating frequencies. For example, the boundary 212 may indicate a minimum voltage level for a particular operating condition of the memory device (e.g., for each particular operating frequency and for a particular age of the memory device) in order to pass the test process. The test process may include determining a number of errors (e.g., bit errors, such as ECC errors or parity errors) associated with information accessed from a set of cells (e.g., the set of memory cells 112) of the memory and adjusting the supply voltage (VDD) in response to the number of errors satisfying a threshold. In a particular embodiment, the information is decoded using a single-error-correct/double-error-detect (SECDED) scheme, and the threshold is satisfied if the number of errors is greater than one. In other embodiments, other error detection schemes and/or other thresholds may be used. To further illustrate, the plot 200 depicts that for a first operating frequency, a first voltage level of the supply voltage (VDD) is associated with a fail status 214 (e.g., two or more errors) when data at the memory device is accessed while the supply voltage (VDD) has the first voltage level. The plot 200 further depicts that a second voltage level (greater than the first voltage level) of the supply voltage (VDD) is associated with a pass status 216 (e.g., a single-bit error or no errors) when the information is accessed while the supply voltage (VDD) has the second voltage level.

A target (e.g., minimum) voltage level associated with a pass status may be determined for each of one or more operating frequencies. In some embodiments, target voltage levels may be determined for multiple operating frequencies. For example, as illustrated in FIG. 2, target voltage levels may be determined for ten operating frequencies of the memory device. In other embodiments, target voltage levels may be determined for more or fewer operating frequencies. In a particular embodiment, target voltages levels may be determined for operating frequencies associated with three particular operating modes, a "turbo" (e.g., high speed) operating mode, a "nominal" (e.g., normal) operating mode, and a "supply voltage supervisor" (SVS) (e.g., low-power) operating mode.

After determining target voltage levels for the multiple operating frequencies, a controller (e.g., the controller 120, via the adjustment circuitry 130 of FIG. 1) of the memory device may generate a bitmap indicating the target voltage levels for the memory device. The controller may store the bitmap at a non-volatile memory of the controller, such as the non-volatile memory 140 of FIG. 1. Each bit of the bitmap may indicate a test process status (e.g., pass or fail) corresponding to a supply voltage (VDD)/operating frequency combination in the plot 200. For example, a bitmap corresponding to the plot 200 may include a plurality of bits corresponding to each of the supply voltage (VDD)/operating frequency combinations in the plot 200. In a particular embodiment, bits having a logical one value represent pass statuses, and bits having a logical zero value represent fail statuses. In other embodiments, a logical zero value may represent a pass status and a logical one value may represent a fail status. As illustrated in FIG. 2, the bitmap may include bits indicating a pass status or a fail status for a combination of seventeen voltage levels of the supply voltage (VDD) and ten operating frequencies. In other embodiments, the bitmap may be generated for a different number of voltage levels of the supply voltage (VDD) and operating frequencies.

FIG. 2 further depicts a plot 220 at a second time (e.g., during a second stage of operation) during the operational life of the memory device (e.g., after a particular number of power cycles of the memory device, after an uncorrectable error occurs, or after occurrence of some other condition, as described above). In the plot 220, the boundary 212 has shifted, which is indicated in FIG. 2 as a boundary 222. The previous boundary (e.g., the boundary 212) is shown in the plot 220 to illustrate differences between the previous boundary 212 and the shifted boundary 222. For example, due to physical wear at the memory device as a result of read and write operations at the memory device, a greater supply voltage (VDD) may be used (for one or more operating frequencies) to achieve a pass status as compared to the plot 200 (e.g., at the first stage of operation of the memory device). To illustrate, a third voltage level (greater than the second voltage level) of the supply voltage (VDD) is associated with a pass status 218 (e.g., a single-bit error or no errors) when the information is accessed while the supply voltage (VDD) has the third voltage level at the second stage of operation of the memory device. In a particular embodiment, the controller of the memory device is configured to determine a second set of target voltage levels (corresponding to the boundary 222) at the second stage of operation and to operate the memory device using the second set of target voltage levels. Although determining target voltage levels for two times (e.g., two stages of operation) is described, target voltage levels may be determined at any number of times (e.g., during any number of stages of operation) during the operational life of the memory device. By determining target voltage levels at later stages of operation, degradation due to "aging" (e.g., physical wear over the operational life of the memory device) may be compensated for by increasing a voltage level of the supply voltage (VDD) to a voltage level associated with a pass condition for a particular operating frequency.

Figure 3:
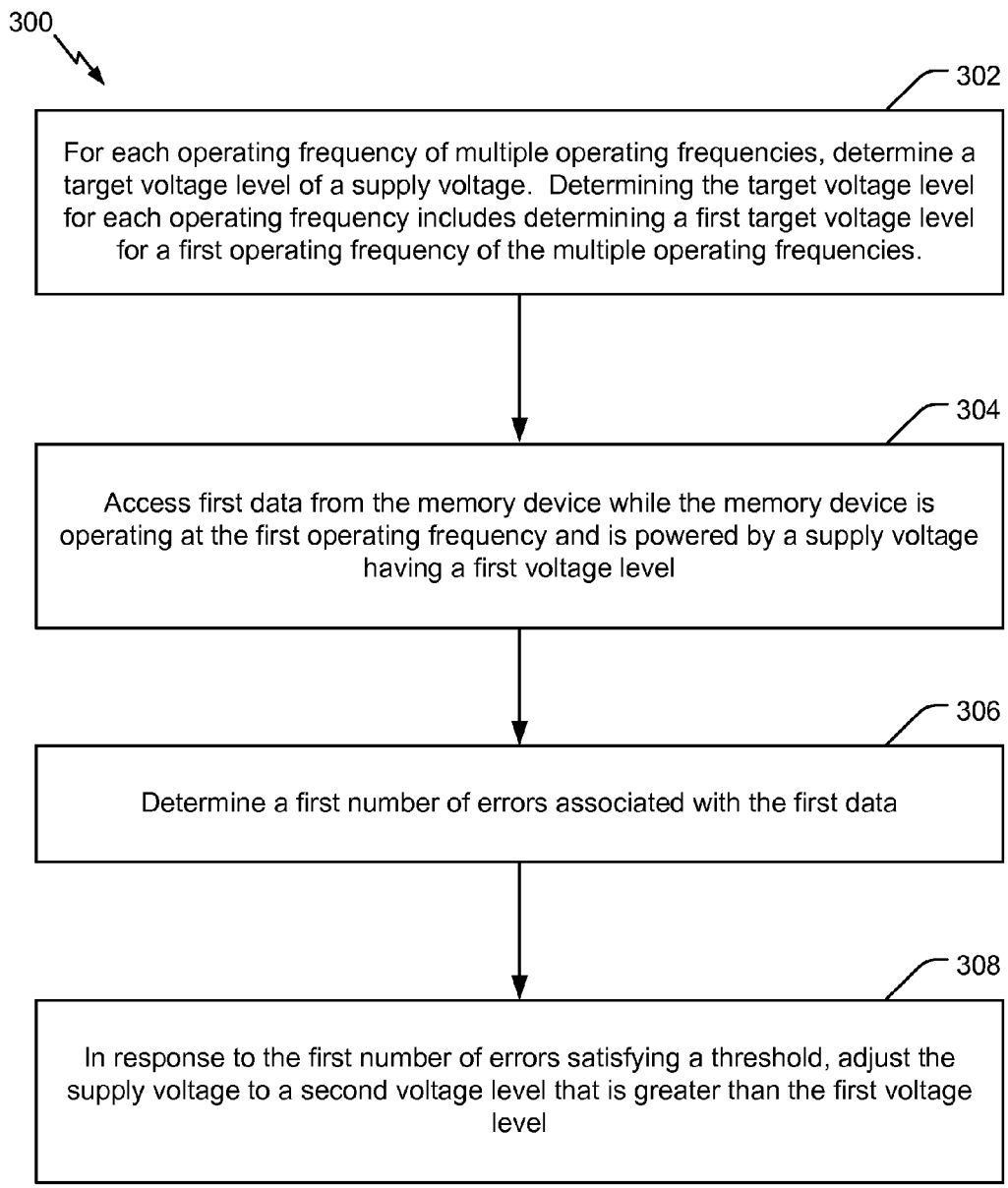
FIG. 3 is a flow chart of a particular illustrative embodiment of a method of operating a memory device.

Referring to FIG. 3, a flow diagram of an illustrative embodiment of a method 300 of operating a memory device is depicted. For example, the memory device may include or correspond to the memory device 102 of FIG. 1. In a particular embodiment, the memory device may include a SRAM device. The method 300 may be performed by the memory device 102, the controller 120, the error detection/correction circuitry 122, and/or the adjustment circuitry 130 of FIG. 1.

The method 300 includes, for each operating frequency of multiple operating frequencies, determining a target voltage level of a supply voltage, at 302. For example, the adjustment circuitry 130 may determine multiple target voltage levels for a supply voltage (VDD) provided to a memory array 110 for multiple operating frequencies of the memory array 110. Determining the target voltage level for each operating frequency includes determining a first target voltage level for a first operating frequency (as described with reference to steps 304-308).

The method 300 includes accessing first data from the memory device while the memory device is operating at the first operating frequency and is powered by a supply voltage having a first voltage level, at 304. For example, the data 114 may be received from the memory array 110 during a first memory access. In a particular embodiment, the data 114 is received from the set of memory cells 112. The memory device may be operated at the first operating frequency by a controller. For example, the controller 120 may be configured to operate the memory array 110 (e.g., to set the operating frequency) at the first operating frequency. Supply circuitry may set the supply voltage to the first voltage level. For example, the supply circuitry 150 may control the power supply 152 to set the supply voltage (VDD) at the first voltage level (e.g., based on the test process output 126).

The method 300 includes determining a first number of errors associated with the first data, at 306. For example, the error detection/correction circuitry 122 may receive the data 114 while the memory array 110 is operating at the first operating frequency and is powered by the supply voltage (VDD) having the first voltage level, and the error detection/correction circuitry 122 may output one or more error indicators 124 when error(s) are detected in the data 114. The first number of errors may be determined by adjustment circuitry. For example, the adjustment circuitry 130 may determine a first number of errors in the data 114 based on the one or more error indicators 124. In a particular embodiment, the adjustment circuitry 130 may include the counter 132 that is configured to count the first number of errors.

The method 300 further includes, in response to the first number of errors satisfying a threshold, adjusting (e.g., increasing) the supply voltage to a second voltage level that is greater than the first voltage level, at 308. For example, the adjustment circuitry 130 may provide a test process output 126 to the supply circuitry 150 to cause the supply circuitry 150 to adjust the supply voltage (VDD) to the second voltage level when the first number of errors satisfies the threshold. The threshold may be a number of errors associated with a particular reliability level of the memory device, and the threshold may be satisfied when the number of errors associated with the first data exceeds the threshold. In a particular embodiment, the threshold is one, and the threshold is satisfied when the number of errors is greater than one (e.g., when a multi-bit error is detected). In some implementations, the errors are parity errors or bit errors (e.g., ECC errors). Adjusting the supply voltage to the second voltage level may be part of a test process that is performed to determine the first target voltage level for the first operating frequency.

In a particular embodiment, the method 300 further includes in response to determining the multiple target voltage levels for the multiple operating frequencies, generating a bitmap indicating the multiple target voltage levels. The method 300 may further include storing the bitmap at a non-volatile memory of the memory device. For example, the adjustment circuitry 130 may generate a bitmap (e.g., a target voltage level bitmap) indicating the multiple target voltage levels determined during a particular test process, and the adjustment circuitry 130 may store the bitmap as one of the one or more target voltage level bitmap(s) 142 at the non-volatile memory 140. In other embodiments, the target voltage levels may be stored as a different data structure, such as a record, a table, or another data structure. In a particular embodiment, the target voltage level bitmap(s) 142 include a bitmap generated after each test process performed by the controller 120 and/or the adjustment circuitry 130.

The method 300 may further include, selecting a particular operating frequency of the multiple operating frequencies after determining multiple target voltage levels and setting the supply voltage to a particular target voltage level that corresponds to a particular operating frequency when operating the memory device at the particular operating frequency. The particular target voltage level may be determined (e.g., selected or identified) based on the bitmap. For example, when the controller 120 operates the memory array 110 at the first operating frequency (e.g., when the controller 120 operates the memory array 110 in an operating mode corresponding to the first operating frequency), the adjustment circuitry 130 may provide the output 128 to the supply circuitry 150. The output 128 may indicate the first target supply voltage and, in response to receipt of the output 128, the supply circuitry 150 may adjust the power supply 152 to set the supply voltage (VDD) to the first target voltage level. The adjustment circuitry 130 may access one or more of the target voltage level bitmap(s) 142 to determine (e.g., select or identify) the first voltage level for use in generating the output 128.

Additionally or alternatively, the method 300 may include determining multiple target voltage levels for multiple operating frequencies during a first test process. For example, the adjustment circuitry 130 may determine a first set of target voltage levels corresponding to the multiple operating frequencies during a first test process. Additionally, the adjustment circuitry 130 may determine a second set of target voltage levels for the multiple operating frequencies in the same manner during a second test process. The second test process may occur subsequent to the first test process, and both test processes may occur during operation of the memory device.

In a particular embodiment, determining the first target voltage level for the first operating frequency includes accessing second data from the memory device while the memory device is operating at the first operating frequency and is powered by the supply voltage having the second voltage level. The first data and the second data may be accessed from a same set of memory cells of the memory device. For example, supply circuitry 150 may adjust the supply voltage (VDD) to the second voltage level, and the second data may be read from the set of memory cells 112. The first data and the second data may both be read from the set of memory cells 112, but may have one or more different bits due to differences in the supply voltage when the first data and the second data are received. Determining the first target voltage level may include determining a second number of errors associated with the second data accessed and, in response to the second number of errors failing to satisfy the threshold, determining the first target voltage level for the first operating frequency based on the second voltage level. For example, the adjustment circuitry 130 may determine the first target voltage level based on the second voltage level when the number of errors detected by the error detection/correction circuitry 122 fails to satisfy the threshold. In some embodiments, the second voltage level may be increased by a guard band voltage component to determine first target voltage level. In other embodiments, the guard band voltage component is not added (e.g., the first target voltage level is the second voltage level). The second voltage level may correspond to a "minimum" test voltage level associated with the number of errors failing to satisfy the threshold. For example, with reference to FIG. 2, the second voltage level may correspond to the voltage level corresponding to pass status 216. Target voltage levels for other operating frequencies of the multiple operating frequencies may be determined in a similar manner to the first target voltage level.

The method 300 may be used to operate a memory device using a supply voltage (VDD) that is scaled to target voltage levels at various stages of the operational life of the memory device. The supply voltage (VDD) may be adjusted (e.g., adaptively scaled) instead of being set to a fixed voltage level based on a "pessimistic" estimate of a worst-case operating condition. For example, the voltage level of the supply voltage (VDD) may be scaled (e.g., adjusted) based on a number of errors detected in data stored at the memory device so that the voltage level is increased until the memory device is associated with a pass status (e.g., the number of errors fails to satisfy a threshold). By adjusting the voltage level of the supply voltage (VDD) instead of setting the voltage level at a fixed voltage level, the memory device may be configured to operate with reduced operating margins, such as a reduced voltage supply margin, as compared to memory devices that are not able to dynamically adjust the supply voltage to account for degradation during the operational life of the memory device.

The method of FIG. 3 may be implemented by a processing unit such as a central processing unit (CPU), a controller, a field-programmable gate array (FPGA) device, an application-specific integrated circuit (ASIC), a digital signal processor (DSP), another hardware device, firmware device, or any combination thereof. In some implementations, the processing unit may be included in the controller 120 of FIG. 1. As an example, the method of FIG. 3 can be performed by one or more processors in the controller 120 that execute instructions.

Figure 4:
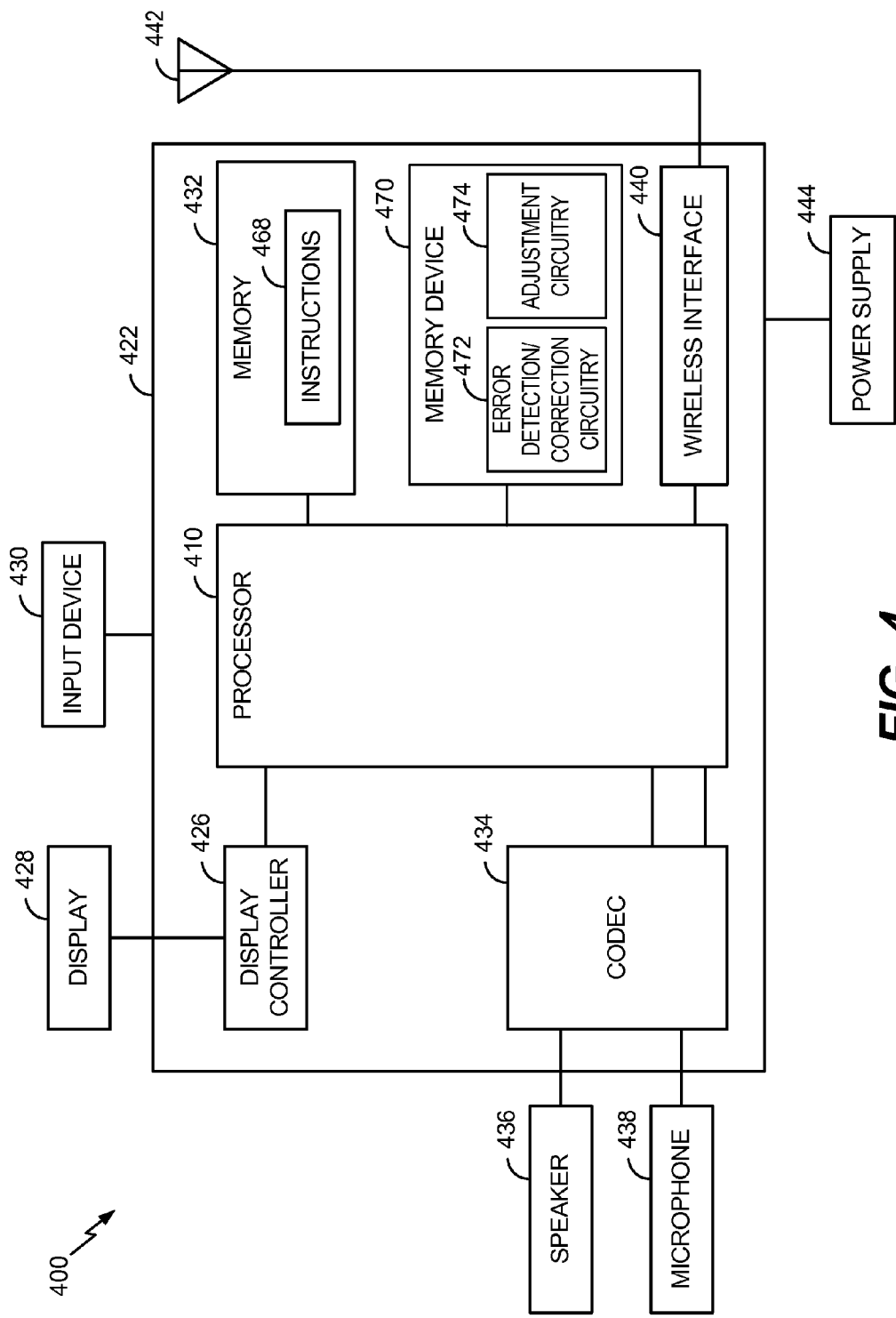
FIG. 4 is a block diagram of an electronic device including the memory device of FIG. 1.

Referring to FIG. 4, a block diagram of a particular illustrative embodiment of a device 400 (e.g., an electronic device), such as a wireless communication device is depicted. The device 400 includes a processor 410, such as a digital signal processor (DSP), coupled to a memory 432 and to a memory device 470. For example, the memory device 470 may include or correspond to the memory device 102 and/or the memory array 110 of FIG. 1. In a particular embodiment, the memory device 470 includes a static random-access memory (SRAM) device.

The memory device 470 may include error detection/correction circuitry 472 and adjustment circuitry 474. For example, the error detection/correction circuitry 472 may include or correspond to the error detection/correction circuitry 122 of FIG. 1, and the adjustment circuitry 474 may include or correspond to the adjustment circuitry 130 of FIG. 1. The error detection/correction circuitry 472 may be configured to detect errors in data stored in the memory device 470. The adjustment circuitry 474 may be configured to determine at least a first target voltage level of a supply voltage of the memory device 470 for a first operating frequency based on a result of a comparison of a number of errors detected by the error detection/correction circuitry 472 to a threshold. In some implementations, the adjustment circuitry 474 may include a supply circuit configured to adjust a voltage level of the supply voltage of the memory device 470. In other implementations, the supply circuit may be distinct from the adjustment circuitry 474.

The memory 432 includes instructions 468 (e.g., executable instructions) such as computer-readable instructions or processor-readable instructions. The instructions 468 may include one or more instructions that are executable by a computer, such as the processor 410. In some implementations, a controller of the memory device 470 initiates the operations described with reference to FIGS. 1-3. In some implementations, one or more operations of the controller may instead be initiated or performed by the processor 410. For example, the instructions 468, when executed by the processor 410, may cause the processor 410 to perform operations including, for each operating frequency of multiple operating frequencies of the memory device 470, determining a target voltage level of a supply voltage. Determining a first target voltage level for a first operating frequency of the multiple operating frequencies may include accessing first data from the memory device 470 while the memory device 470 is operating at the first operating frequency and is powered by a supply voltage having a first voltage level. Determining the first target voltage level may include determining a first number of errors associated with the first data. Determining the first target voltage level may further include, in response to the first number of errors satisfying a threshold, adjusting the supply voltage to a second voltage level that is greater than the first voltage level.

FIG. 4 also shows a display controller 426 that is coupled to the processor 410 and to a display 428. A coder/decoder (CODEC) 434 can also be coupled to the processor 410. A speaker 436 and a microphone 438 can be coupled to the CODEC 434.

FIG. 4 also indicates that a wireless interface 440, such as a wireless controller, can be coupled to the processor 410 and to an antenna 442. In some implementations, the processor 410, the display controller 426, the memory 432, the memory device 470, the CODEC 434, and the wireless interface 440 are included in a system-in-package or system-on-chip device 422. In a particular embodiment, an input device 430 and a power supply 444, such as the power supply 152 of FIG. 1, are coupled to the system-on-chip device 422. Moreover, in a particular embodiment, as illustrated in FIG. 4, the display 428, the input device 430, the speaker 436, the microphone 438, the antenna 442, and the power supply 444 are external to the system-on-chip device 422. However, each of the display 428, the input device 430, the speaker 436, the microphone 438, the antenna 442, and the power supply 444 can be coupled to a component of the system-on-chip device 422, such as an interface or a controller. In some implementations, the memory device 470 may be included in a component of the device 400 or a component coupled to the device 400. For example, the memory device 470 may be included in the processor 410, the wireless interface 440, the display controller 426, or another component that includes a memory device (e.g., an SRAM device).

In conjunction with one or more of the described embodiments of FIGS. 1-4, an apparatus is disclosed that may include means for storing data. The means for storing data may include or correspond to the memory device 102, the memory array 110, the set of memory cells 112 of FIG. 1, the memory device 470 of FIG. 4, one or more other structures or circuits configured to store data, or any combination thereof.

The apparatus may also include means for determining a target voltage level of a supply voltage for the means for storing for each operating frequency of multiple operating frequencies of the means for storing. A first target voltage level may be determined based on a result of a comparison of a number of errors detected in the data and a threshold, and the first target voltage level may correspond to a first operating frequency of the multiple operating frequencies. The means for determining may include or correspond to the controller 120, the adjustment circuitry 130 of FIG. 1, the processor 410, the adjustment circuitry 474 of FIG. 4, one or more other structures or circuits configured to determine the first target voltage level of the supply voltage based on the result of the comparison of the number of errors to the threshold, or any combination thereof.

In a particular embodiment, the apparatus includes means for detecting errors in the data and means for providing the supply voltage to the means for storing data. A voltage level of the supply voltage may be adjusted based on an output from the means for determining. The means for detecting errors may include the controller 120, the error detection/correction circuitry 122 of FIG. 1, the processor 410, the error detection/correction circuitry 472 of FIG. 4, one or more other structures or circuits configured to detect errors in the data, or any combination thereof. The means for providing the supply voltage may include the controller 120, the supply circuitry 150, the power supply 152 of FIG. 1, the processor 410, the adjustment circuitry 474 of FIG. 4, one or more other structures or circuits configured to provide the supply voltage to the means for storing, or any combination thereof.

One or more of the disclosed embodiments may be implemented in a system or an apparatus, such as the device 400, that may include a communications device, a personal digital assistant (PDA), a mobile phone, a cellular phone, a satellite phone, a navigation device, a computer, a tablet, a portable computer, or a desktop computer. Additionally or alternatively, the device 400 may include a set top box, an entertainment unit, a fixed location data unit, a mobile location data unit, a display device, a monitor, a computer monitor, a television, a tuner, a radio, a satellite radio, a music player, a digital music player, a portable music player, a video player, a digital video player, a digital video disc (DVD) player, a portable digital video player, a satellite, a vehicle, any other device that includes a memory or that stores or retrieves data or computer instructions. As another illustrative, non-limiting example, the system or the apparatus may include remote units, such as hand-held personal communication systems (PCS) units, portable data units such as global positioning system (GPS) enabled devices, meter reading equipment, or any other device that includes a processor or that stores or retrieves data or computer instructions, or any combination thereof.

Figure 5:
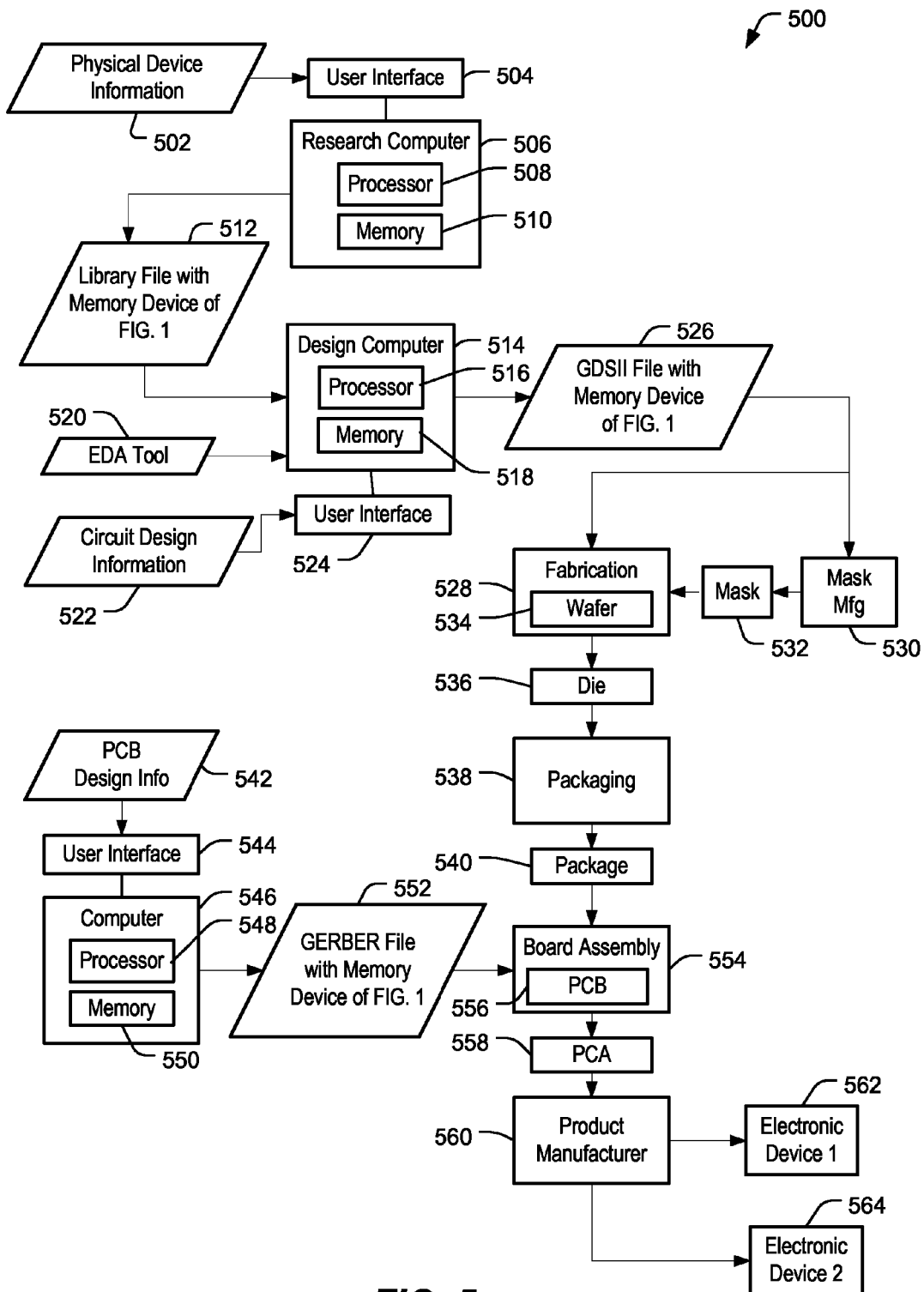
FIG. 5 is a data flow diagram of a particular illustrative embodiment of a manufacturing process to manufacture electronic devices that include the memory device of FIG. 1.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 5 depicts a particular illustrative embodiment of an electronic device manufacturing process 500.

Physical device information 502 is received at the manufacturing process 500, such as at a research computer 506. The physical device information 502 may include design information representing at least one physical property of a semiconductor device, such as the memory device 102. For example, the physical device information 502 may include physical parameters, material characteristics, and structure information that is entered via a user interface 504 coupled to the research computer 506. The research computer 506 includes a processor 508, such as one or more processing cores, coupled to a computer readable medium (e.g., a non-transitory computer-readable medium) such as a memory 510. The memory 510 may store computer readable instructions that are executable to cause the processor 508 to transform the physical device information 502 to comply with a file format and to generate a library file 512.

In a particular embodiment, the library file 512 includes at least one data file including the transformed design information. For example, the library file 512 may include a library of semiconductor devices including a device that includes the memory device 102, that is provided for use with an electronic design automation (EDA) tool 520.

The library file 512 may be used in conjunction with the EDA tool 520 at a design computer 514 including a processor 516, such as one or more processing cores, coupled to a memory 518. The EDA tool 520 may be stored as processor executable instructions at the memory 518 to enable a user of the design computer 514 to design a circuit including the memory device 102, of the library file 512. For example, a user of the design computer 514 may enter circuit design information 522 via a user interface 524 coupled to the design computer 514. The circuit design information 522 may include design information representing at least one physical property of a semiconductor device, such as the memory device 102. To illustrate, the circuit design property may include identification of particular circuits and relationships to other elements in a circuit design, positioning information, feature size information, interconnection information, or other information representing a physical property of a semiconductor device.

The design computer 514 may be configured to transform the design information, including the circuit design information 522, to comply with a file format. To illustrate, the file format may include a database binary file format representing planar geometric shapes, text labels, and other information about a circuit layout in a hierarchical format, such as a Graphic Data System (GDSII) file format. The design computer 514 may be configured to generate a data file including the transformed design information, such as a GDSII file 526 that includes information describing the memory device 102, in addition to other circuits or information. To illustrate, the data file may include information corresponding to a system-on-chip (SOC) that includes the memory device 102, and that also includes additional electronic circuits and components within the SOC.

The GDSII file 526 may be received at a fabrication process 528 to manufacture the memory device 102, or a combination thereof, according to transformed information in the GDSII file 526. For example, a device manufacture process may include providing the GDSII file 526 to a mask manufacturer 530 to create one or more masks, such as masks to be used with photolithography processing, illustrated as a representative mask 532. The mask 532 may be used during the fabrication process to generate one or more wafers 534, which may be tested and separated into dies, such as a representative die 536. The die 536 includes a circuit including a device that includes the memory device 102.

The die 536 may be provided to a packaging process 538 where the die 536 is incorporated into a representative package 540. For example, the package 540 may include the single die 536 or multiple dies, such as a system-in-package (SiP) arrangement. The package 540 may be configured to conform to one or more standards or specifications, such as Joint Electron Device Engineering Council (JEDEC) standards.

Information regarding the package 540 may be distributed to various product designers, such as via a component library stored at a computer 546. The computer 546 may include a processor 548, such as one or more processing cores, coupled to a memory 550. A printed circuit board (PCB) tool may be stored as processor executable instructions at the memory 550 to process PCB design information 542 received from a user of the computer 546 via a user interface 544. The PCB design information 542 may include physical positioning information of a packaged semiconductor device on a circuit board, the packaged semiconductor device corresponding to the package 540 including the memory device 102.

The computer 546 may be configured to transform the PCB design information 542 to generate a data file, such as a GERBER file 552 with data that includes physical positioning information of a packaged semiconductor device on a circuit board, as well as layout of electrical connections such as traces and vias, where the packaged semiconductor device corresponds to the package 540 including the memory device 102. In other embodiments, the data file generated by the transformed PCB design information may have a format other than a GERBER format.

The GERBER file 552 may be received at a board assembly process 554 and used to create PCBs, such as a representative PCB 556, manufactured in accordance with the design information stored within the GERBER file 552. For example, the GERBER file 552 may be uploaded to one or more machines to perform various steps of a PCB production process. The PCB 556 may be populated with electronic components including the package 540 to form a representative printed circuit assembly (PCA) 558.

The PCA 558 may be received at a product manufacture process 560 and integrated into one or more electronic devices, such as a first representative electronic device 562 and a second representative electronic device 564. For example, the first representative electronic device 562, the second representative electronic device 564, or both, may include or correspond to the wireless communication device 400 of FIG. 4. As an illustrative, non-limiting example, the first representative electronic device 562, the second representative electronic device 564, or both, may include a mobile phone, a cellular phone, a satellite phone, a tablet computer, a portable computer, a radio, a satellite radio, a communication device, a portable music player, a portable digital video player, a navigation device, a personal digital assistant (PDA), a mobile location data unit, a set top box, an entertainment unit, a fixed location data unit, a desktop computer, a display device (e.g., a monitor, a computer monitor, a television, etc.), a tuner, a media player (e.g., a music player), a digital music player, a portable music player, a video player, a digital video player, a digital video disc (DVD) player, a portable digital video player, any other device that stores or retrieves data or computer instructions, or a combination thereof, into which the memory device 102 is integrated. As another illustrative, non-limiting example, one or more of the electronic devices 562 and 564 may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 5 illustrates remote units according to teachings of the disclosure, the disclosure is not limited to these illustrated units. Embodiments of the disclosure may be suitably employed in any device which includes active integrated circuitry including memory and on-chip circuitry.

A device that includes the memory device 102, may be fabricated, processed, and incorporated into an electronic device, as described in the illustrative process 500. One or more aspects of the embodiments disclosed with respect to FIGS. 1-4 may be included at various processing stages, such as within the library file 512, the GDSII file 526 (e.g., a file having a GDSII format), and the GERBER file 552 (e.g., a file having a GERBER format), as well as stored at the memory 510 of the research computer 506, the memory 518 of the design computer 514, the memory 550 of the computer 546, the memory of one or more other computers or processors (not shown) used at the various stages, such as at the board assembly process 554, and also incorporated into one or more other physical embodiments such as the mask 532, the die 536, the package 540, the PCA 558, other products such as prototype circuits or devices (not shown), or any combination thereof. Although various representative stages of production from a physical device design to a final product are depicted, in other embodiments fewer stages may be used or additional stages may be included. Similarly, the process 500 may be performed by a single entity or by one or more entities performing various stages of the process 500.

Although one or more of FIGS. 1-5 may illustrate systems, apparatuses, and/or methods according to the teachings of the disclosure, the disclosure is not limited to these illustrated systems, apparatuses, and/or methods. Embodiments of the disclosure may be suitably employed in any device that includes a memory device. Additionally, one or more functions or components of any of FIGS. 1-5 as illustrated or described herein may be combined with one or more other portions of another of FIGS. 1-5. Accordingly, no single embodiment described herein should be construed as limiting and embodiments of the disclosure may be suitably combined without departing form the teachings of the disclosure.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. For example, a storage medium may be coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method of operation of a memory device, the method comprising:

for each operating frequency of multiple operating frequencies, determining a target voltage level of a supply voltage, wherein determining a first target voltage level for a first operating frequency of the multiple operating frequencies comprises:

accessing first data from the memory device while the memory device is operating at the first operating frequency and is powered by the supply voltage having a first voltage level;

determining a first number of errors associated with the first data;

in response to the first number of errors satisfying a threshold, adjusting the supply voltage to a second voltage level that is greater than the first voltage level; and accessing second data from the memory device while the memory device is operating at the first operating frequency and is powered by the supply voltage having the second voltage level; and in response to determining multiple target voltage levels for the multiple operating frequencies, generating a bitmap indicating the multiple target voltage levels; and storing the bitmap at a non-volatile memory of the memory device.

2. The method of claim 1, further comprising:
selecting a particular operating frequency of the multiple operating frequencies after determining multiple target voltage levels; and
setting the supply voltage to a particular target voltage level that corresponds to the particular operating frequency when operating the memory device at the particular operating frequency, wherein the particular target voltage level is determined based on the bitmap.

3. The method of claim 1, wherein multiple target voltage levels are determined for the multiple operating frequencies during a first test process performed during operation of the memory device.

4. The method of claim 1, wherein the first data and the second data are accessed from a same set of memory cells of the memory device, and further comprising:
determining a second number of errors associated with the second data; and
in response to the second number of errors failing to satisfy the threshold, setting the first target voltage level for the first operating frequency based on the second voltage level, wherein the memory device is readable while the supply voltage has the first target voltage level.

5. The method of claim 4, wherein the second voltage level corresponds to a minimum test voltage level associated with the second number of errors failing to satisfy the threshold.

6. The method of claim 4, wherein the first target voltage level is set to a third voltage level that is equal to a sum of the second voltage level and a guard band voltage component.

7. The method of claim 6, wherein the guard band voltage component is based on one or more characteristics of the memory device, the one or more characteristics including a temperature, the target voltage level, a workload, an operating mode, the first operating frequency, or a combination thereof.

8. The method of claim 1, wherein the threshold corresponds to a number of errors associated with a particular reliability level of the memory device, wherein the threshold is satisfied when the number of errors associated with the first data exceeds the threshold.

9. The method of claim 8, wherein the threshold has a value of one, and wherein the number of errors satisfies the threshold when the number of errors is greater that one.

10. The method of claim 8, wherein the errors include parity errors associated with the first data or bit errors associated with the first data.

11. The method of claim 10, wherein the errors include multi-bit errors corresponding to two or more incorrect bits in at data word.

12. The method of claim 1, wherein the memory device includes a static random access memory (SRAM) device, and wherein accessing the first data, determining the first number of errors, and adjusting the supply voltage are performed at a processor integrated into an electronic device.

13. A memory device comprising:
an array of storage elements;
error detection circuitry configured to detect errors in data stored in the array; and
adjustment circuitry configured to:
determine a target voltage level of a supply voltage for the array for each operating frequency of multiple operating frequencies of the array,
wherein a first target voltage level that corresponds to a first operating frequency of the multiple operating frequencies is determined by:
a determination of a number of errors detected by the error detection circuitry in data read from the array while the array operates at the first operating frequency and is powered by the supply voltage having a first voltage level;
in response to the number of errors satisfying a threshold, an adjustment of the supply voltage to a second voltage level that is greater than the first voltage level; and
a access of second data from the memory device while the memory device operates at the first operating frequency and is powered by the supply voltage having the second voltage level;
in response to a determination of multiple target voltage levels for the multiple operating frequencies, generate a bitmap that indicates the multiple target voltage levels; and
store the bitmap at a non-volatile memory of the memory device.

14. The memory device of claim 13, wherein the adjustment circuitry is further configured to determine a second set of target voltage levels for the multiple operating frequencies during a second test process, and wherein the second test process occurs subsequent to a first test process in which a first set of target voltage levels for the multiple operating frequencies is determined.

15. The memory device of claim 13, wherein the error detection circuitry includes parity check circuitry.

16. The memory device of claim 13, wherein the error detection circuitry includes an error correcting code (ECC) decoder.

17. The memory device of claim 16, wherein the ECC decoder includes a single-error-correct/double-error-detect (SECDED) decoder.

18. The memory device of claim 13, further comprising a power supply circuit configured to provide the supply voltage to the array.

19. The memory device of claim 18, wherein the adjustment circuitry is further configured to, after determining the first target voltage level, provide an output to the power supply circuit when the array is being operated at the first operating frequency, wherein the output indicates the first target voltage level, and wherein the power supply circuit is further configured to set a voltage level of the supply voltage to the first target voltage level based on receipt of the output.

20. The memory device of claim 13, wherein the adjustment circuitry includes one or more sensors configured to determine one or more operating characteristics of the array, wherein the adjustment circuitry is further configured to determine a guard band voltage based on the one or more operating characteristics, and wherein the first target voltage level is set to a third voltage level based on a sum of the second voltage level and the guard band voltage.

21. The memory device of claim 13, further comprising the non-volatile memory configured to store one or more bitmaps that indicate multiple target voltage levels for the multiple operating frequencies, guard band voltage data, or a combination thereof, wherein the one or more bitmaps include the generated bitmap.

22. The memory device of claim 13, further comprising a plurality of arrays of storage elements including the array, wherein a first array of the plurality of arrays operates at a first operating frequency and the memory device operates at a second operating frequency, wherein the first array of the plurality of arrays operates in a first operating mode and the memory device operates in a second operating mode, and wherein the first operating frequency is different from the second operating frequency, the first operating mode is different from the second operating mode, or both.

23. The memory device of claim 13, further comprising a plurality of arrays of storage elements including the array, wherein a first array of the plurality of arrays operates at a first operating frequency and a second array of the plurality of arrays operates at a second operating frequency, wherein the first array of the plurality of arrays operates in a first operating mode and the second array of the plurality of arrays operates in a second operating mode, and wherein the first operating frequency is different from the second operating frequency, the first operating mode is different from the second operating mode, or both.

24. The memory device of claim 20, wherein the one or more operating characteristics include a temperature, the target voltage level, a workload, an operating mode, the first operating frequency, or a combination thereof.

25. The memory device of claim 21, wherein at least one bitmap of the one or more bitmaps includes a plurality of bits corresponding to the multiple target voltage levels, the multiple operating frequencies, or a combination thereof, and wherein at least one bit of the plurality of bits indicates a pass status or a fail status for the combination of a target voltage level of the multiple target voltage levels and an operating frequency of the multiple operating frequencies.

26. An apparatus comprising:
means for storing data;
means for determining a target voltage level of a supply voltage for the means for storing data for each operating frequency of multiple operating frequencies of the means for storing data, wherein a first target voltage level corresponds to a first operating frequency of the multiple operating frequencies;
means for detecting errors in the data, the means for detecting configured to compare a number of errors detected in the data and a threshold and configured to determine the first target voltage level based on a result of the comparison;
means for providing the supply voltage to the means for storing, the means for providing the supply voltage configured to adjust a voltage level of the supply voltage based on an output from the means for determining, wherein the means for storing data is configured to be powered by the supply voltage at the first target voltage level, and wherein the means for storing is configured to be readable while the supply voltage has the first target voltage level; and
means for generating a bitmap indicating multiple target voltage levels in response to determining the multiple target voltage levels of a supply voltage for the means for storing data,
wherein the means for storing stores the bitmap.

27. The apparatus of claim 26, wherein the means for storing and the means for determining are integrated in at least one semiconductor die.

28. The apparatus of claim 26, wherein the means for storing and the means for determining are integrated in a communications device, a personal digital assistant (PDA), a mobile phone, a cellular phone, a satellite phone, a navigation device, a computer, a tablet computer, a portable computer, a desktop computer, a set top box, an entertainment unit, a fixed location data unit, a mobile location data unit, a monitor, a computer monitor, a television, a tuner, a radio, a satellite radio, a music player, a digital music player, a portable music player, a video player, a digital video player, a digital video disc (DVD) player, a portable digital video player, or a combination thereof.

29. A non-transitory computer-readable medium storing instructions that, when executed by a processor, cause the processor to perform operations comprising:
for each operating frequency of multiple operating frequencies of a memory device, determining a target voltage level of a supply voltage, wherein determining a first target voltage level for a first operating frequency of the multiple operating frequencies comprises:
accessing first data from the memory device while the memory device is operating at the first operating frequency and is powered by the supply voltage having a first voltage level;
determining a first number of errors associated with the first data; and
in response to the first number of errors satisfying a threshold, adjusting the supply voltage to a second voltage level that is greater than the first voltage level;
accessing second data from the memory device while the memory device is operating at the first operating frequency and is powered by the supply voltage having the second voltage level;
in response to determining of multiple target voltage levels for the multiple operating frequencies, generating a bitmap indicating the multiple target voltage levels; and
storing the bitmap at a non-volatile memory of the memory device.

30. The non-transitory computer-readable medium of claim 29, wherein the operations further comprise:
storing target voltage data representing multiple target voltage levels for the multiple operating frequencies at the non-volatile memory;
accessing the target voltage data to determine a particular target voltage level corresponding to a particular operating frequency of the multiple operating frequencies; and
setting the supply voltage to the particular target voltage level when operating the memory device at the particular operating frequency.

* * * * *